(12) United States Patent
Aritome

(10) Patent No.: US 7,440,321 B2
(45) Date of Patent: Oct. 21, 2008

(54) MULTIPLE SELECT GATE ARCHITECTURE WITH SELECT GATES OF DIFFERENT LENGTHS

(75) Inventor: Seiichi Aritome, Boise, ID (US)

(73) Assignee: Micron Technology, Inc., Boise, ID (US)

(*) Notice: Subject to any disclaimer, the term of this patent is extended or adjusted under 35 U.S.C. 154(b) by 300 days.

(21) Appl. No.: 11/402,535

(22) Filed: Apr. 12, 2006

(65) Prior Publication Data

US 2007/0242515 A1    Oct. 18, 2007

(51) Int. Cl.
*G11C 11/34* (2006.01)

(52) U.S. Cl. .............................. 365/185.17; 365/185.05

(58) Field of Classification Search ............ 365/185.17, 365/185.05
See application file for complete search history.

(56) References Cited

U.S. PATENT DOCUMENTS

| 7,120,059 B2* | 10/2006 | Yeh ........................ 365/185.19 |
| 2005/0088890 A1* | 4/2005 | Matsunaga et al. .......... 365/202 |
| 2008/0101126 A1* | 5/2008 | Hemink et al. ......... 365/185.19 |

* cited by examiner

*Primary Examiner*—Tuan T. Nguyen
(74) *Attorney, Agent, or Firm*—Leffert Jay & Polglaze, P.A.

(57) ABSTRACT

A portion of a memory array has a string of two or more non-volatile memory cells, a first select gate coupled in series with one non-volatile memory cell of the string of two or more non-volatile memory cells, and a second select gate coupled in series with the first select gate. A length of the second select gate is greater than a length of the first select gate.

52 Claims, 6 Drawing Sheets

MULTIPLE SELECT GATE ARCHITECTURE WITH SELECT GATES OF DIFFERENT LENGTHS

TECHNICAL FIELD OF THE INVENTION

The present invention relates generally to memory devices and in particular the present invention relates to a multiple select gate architecture with select gates of different lengths.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage or trapping layers or other physical phenomena, determine the data value of each cell. Common uses for flash memory include personal computers, personal digital assistants (PDAs), digital cameras, digital media players, cellular telephones and removable memory modules.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series to form a string, commonly called a NAND string, of memory cells with only a memory cell at one end of the NAND string coupled to a bit line.

As the performance of electronic systems employing flash memory devices increases, flash memory device performance should also increase. A performance increase includes reducing power consumption, increasing speed, and increasing the memory density. One way to accomplish these tasks is by decreasing the size of the memory array and its individual devices.

Unfortunately, there can be resulting problems with decreasing device sizes. For example, as the channel length and gate oxide thickness are reduced in a field-effect transistor, leakage current generally increases. One type of leakage current is gate induced drain leakage (GIDL) that results from the depletion at the drain surface below the gate-drain overlap region.

GIDL can cause a problem referred to as program disturb during a programming operation of a flash memory array. For example, FIG. 1 illustrates a portion of a typical prior art NAND flash memory array. During a program operation to program a memory cell 101, the word line 102 coupled to that cell 101 may be biased with a 20V programming pulse. The bit line 104 coupled to that cell may be brought to ground potential. This provides a gate to source potential of 20V across the cell 101 to be programmed.

The other cells on the selected word line 102 will also have the 20V programming pulse applied. In order to inhibit these cells from being programmed, their bit lines 104 may be biased to Vcc. Additionally, the remaining unselected word lines may be biased with 10V pulses. This biasing creates a channel voltage of approximately 7V on the unselected cell 103. This provides a gate to source voltage of approximately 13V that is generally below the required programming voltage for such cells.

However, the resulting drain to gate field for the drain select gates (SGD) and source select gates (SGS) may, in this scenario, approach 7V, which can cause the 7V channel potential on the unselected cell 103 to leak away, thus creating the possibility that the unselected cell 103 is programmed. This is referred to in the art as program disturb.

Commonly assigned U.S. patent application Ser. No. 11/216,755, filed on Aug. 31, 2005, uses multiple series-coupled select gates on the drain and/or source ends of NAND strings to enable each gate to be made using smaller feature sizes while achieving the same level of protection against GIDL and other forms of current leakage. However, during a read operation punch-through may still be a concern even with multiple select gates.

For the reasons stated above, and for other reasons stated below which will become apparent to those skilled in the art upon reading and understanding the present specification, there is a need in the art for alternative memory device architectures.

SUMMARY

The above-mentioned problems with memory devices and other problems are addressed by the present invention and will be understood by reading and studying the following specification.

For one embodiment, the invention provides a portion of a memory array having a string of two or more non-volatile memory cells, a first select gate coupled in series with one non-volatile memory cell of the string of two or more non-volatile memory cells, and a second select gate coupled in series with the first select gate. A length of the second select gate is greater than a length of the first select gate.

Further embodiments of the invention include methods and apparatus of varying scope.

DETAILED DESCRIPTION

Figure 1:
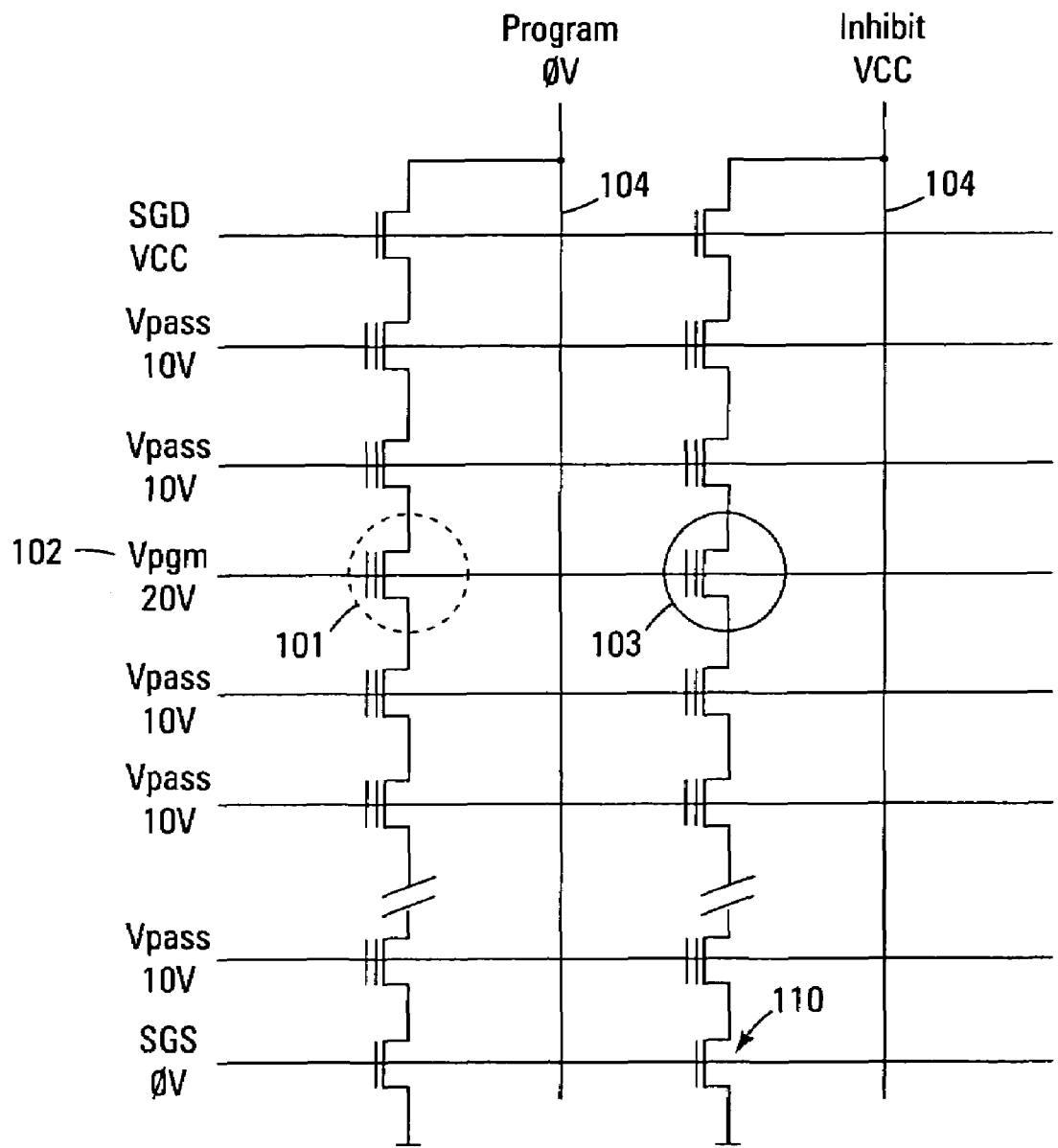
FIG. 1 is a schematic of a portion of a NAND memory array of the prior art.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The term wafer or substrate used in the following description includes any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

Figure 2:
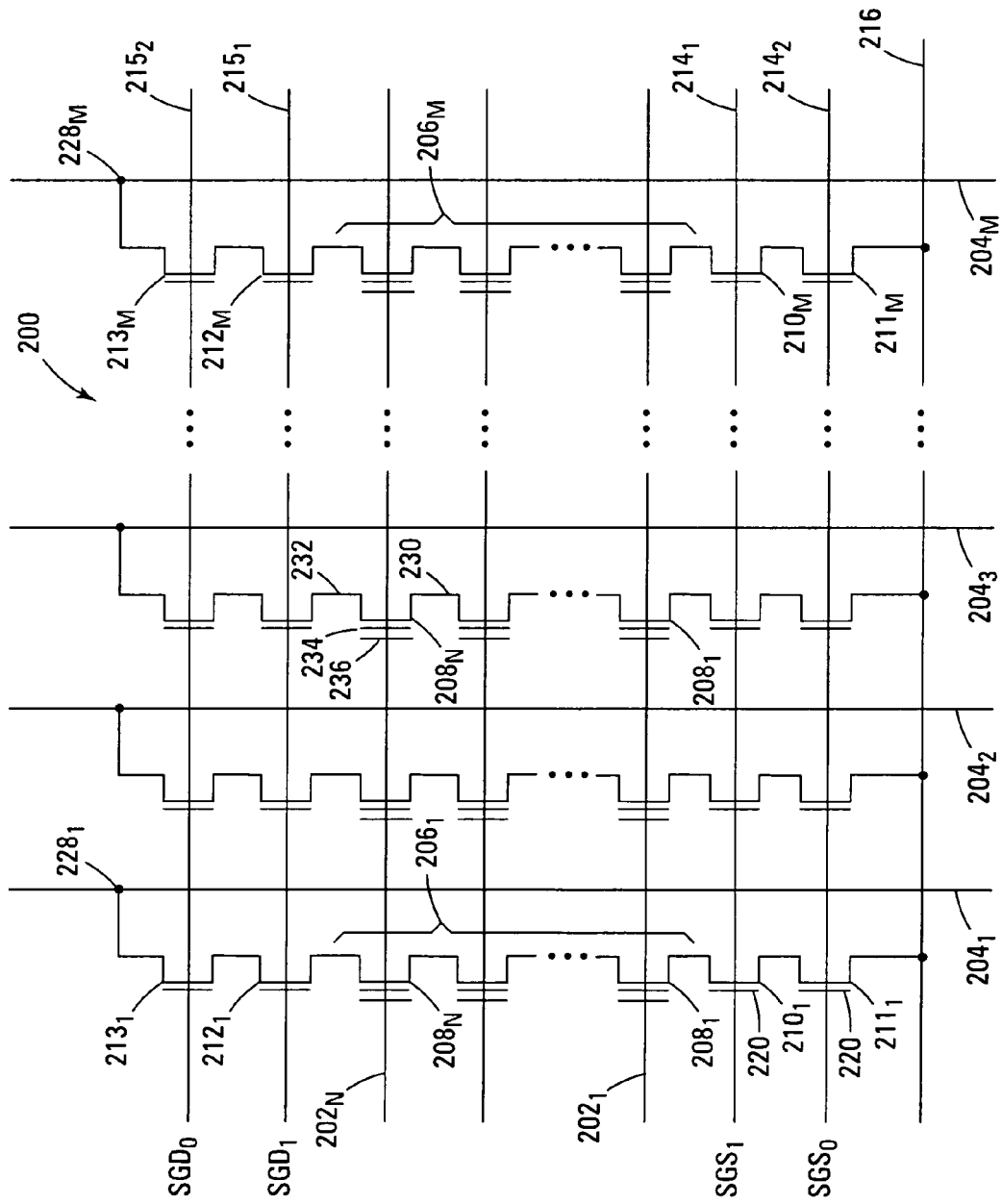
FIG. 2 is a schematic of a portion of a NAND memory array in accordance with an embodiment of the invention.

FIG. 2 is a schematic of a portion of a NAND memory array 200 in accordance with an embodiment of the invention. As shown in FIG. 2, the memory array 200 includes word lines $202_1$ to $202_N$ and intersecting bit lines $204_1$ to $204_M$. For ease of addressing in the digital environment, the number of word lines 202 and the number of bit lines 204 are each some power of two, e.g., 256 word lines 202 by 4,096 bit lines 204.

Memory array 200 includes NAND strings $206_1$ to $206_M$. Each NAND string includes non-volatile memory cells $208_1$ to $208_N$, each located at an intersection of a word line 202 and a local bit line 204. The non-volatile memory cells 208 of each NAND string 206 are connected in series source to drain between series-connected source select gates 210 and 211, e.g., field-effect transistors (FETs), and series-connected drain select gates 212 and 213, e.g., FETs. Series-connected source select gates 210 and 211 may have different lengths and/or series-connected drain select gates 212 and 213 may have different lengths and thus different channel lengths in accordance with embodiments of the invention. Source select gates 210 and 211 are located at intersections of a local bit line 204 and source select lines 214, while drain select gates 212 and 213 are located at intersections of a local bit line 204 and drain select lines 215. For one embodiment, source select gates 210 and 211 and/or drain select gates 212 and 213 are enhancement-type devices. For another embodiment, source select lines 214 may be coupled together so that the control gates of source select gates 210 and 211 share a common source select line. For yet another embodiment, drain select lines 215 may be coupled together so that the control gates of drain select gates 212 and 212 share a common drain select line.

A source of each source select gate 211 is connected to a common source line 216. The drain of each source select gate 211 is connected to the source of a corresponding source select gate 210. The drain of each source select gate 210 is connected to the source of the first floating-gate transistor 208 of the corresponding NAND string 206. For example, the drain of source select gate $211_1$ is connected to the source of source select gate $210_1$, which is connected to the source of floating-gate transistor $208_1$ of the corresponding NAND string $206_1$. A control gate 220 of each source select gate 210 and 211 is connected to source select line 214.

The drain of each drain select gate 213 is connected to a local bit line 204 for the corresponding NAND string at a drain contact 228. For example, the drain of drain select gate $213_1$, is connected to the local bit line $204_1$ for the corresponding NAND string $206_1$ at drain contact $228_1$. The source of each drain select gate 213 is connected to the drain of the corresponding drain select gate 212. The source of each drain select gate 212 is connected to the drain of the last floating-gate transistor 208 of the corresponding NAND string 206.

For example, the source of drain select gate $212_1$ is connected to the drain of floating-gate transistor $208_N$ of the corresponding NAND string $206_1$.

Typical construction of non-volatile memory cells 208 includes a source 230 and a drain 232, a floating gate or charge storage layer 234, and a control gate 236, as shown in FIG. 2. Non-volatile memory cells 208 have their control gates 236 coupled to a word line 202. A column of the non-volatile memory cells 208 are those NAND strings 206 coupled to a given local bit line 204. A row of the non-volatile memory cells 208 are those transistors commonly coupled to a given word line 202. An AND array architecture would be similarly laid out except that the string of memory cells would be coupled in parallel between the select gates.

Figure 3:
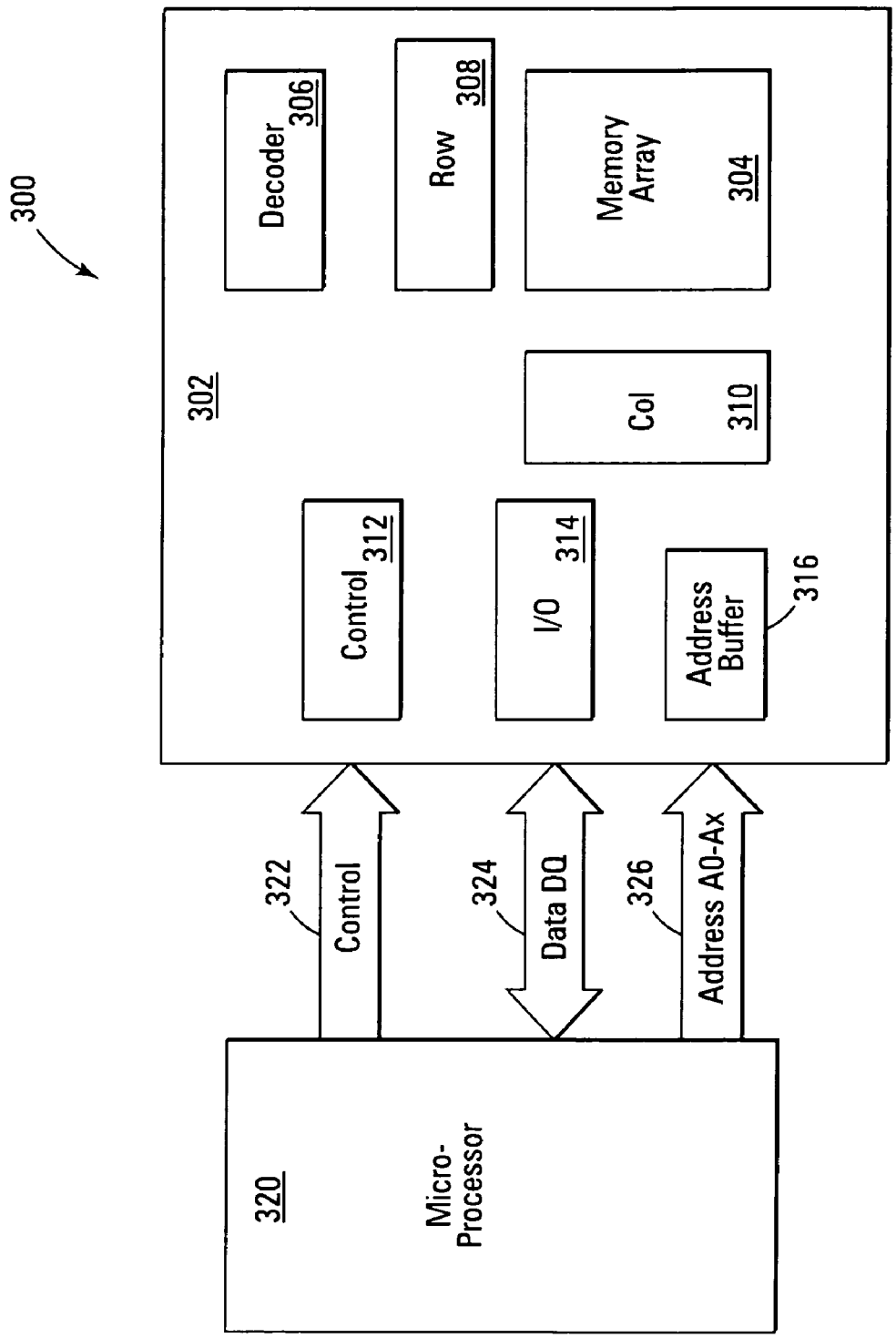
FIG. 3 is a simplified block diagram of an electronic system, according to an embodiment of the invention.

FIG. 3 is a simplified block diagram of an electronic system 300, according to an embodiment of the invention. Electronic system 300 includes a non-volatile memory device 302 that includes an array of non-volatile memory cells 304, an address decoder 306, row access circuitry 308, column access circuitry 310, control circuitry 312, Input/Output (I/O) circuitry 314, and an address buffer 316. The array of non-volatile memory cells 304 has series-connected select gates for access to strings of memory cells, where the series-connected select gates have different lengths, in accordance with embodiments of the invention. The control circuitry 312 is adapted to perform methods in accordance with embodiments of the invention. The memory cells (not shown in FIG. 3) of the array of non-volatile memory cells 304 may be floating-gate memory cells, NROM cells or other type of one-transistor non-volatile memory cells.

Electronic system 300 includes an external processor 320, e.g., a memory controller or host processor, electrically connected to memory device 302 for memory accessing. The memory device 302 receives control signals from the processor 320 over a control link 322. The memory cells are used to store data that are accessed via a data (DQ) link 324. Address signals are received via an address link 326 that are decoded at address decoder 306 to access the memory array 304. Address buffer circuit 316 latches the address signals. The memory cells are accessed in response to the control signals and the address signals. The control link 322, data link 324 and address link 326 can be collectively referred to as access lines. It will be appreciated by those skilled in the art that additional circuitry and control signals can be provided, and that the memory device of FIG. 3 has been simplified to help focus on the invention.

Figure 4:
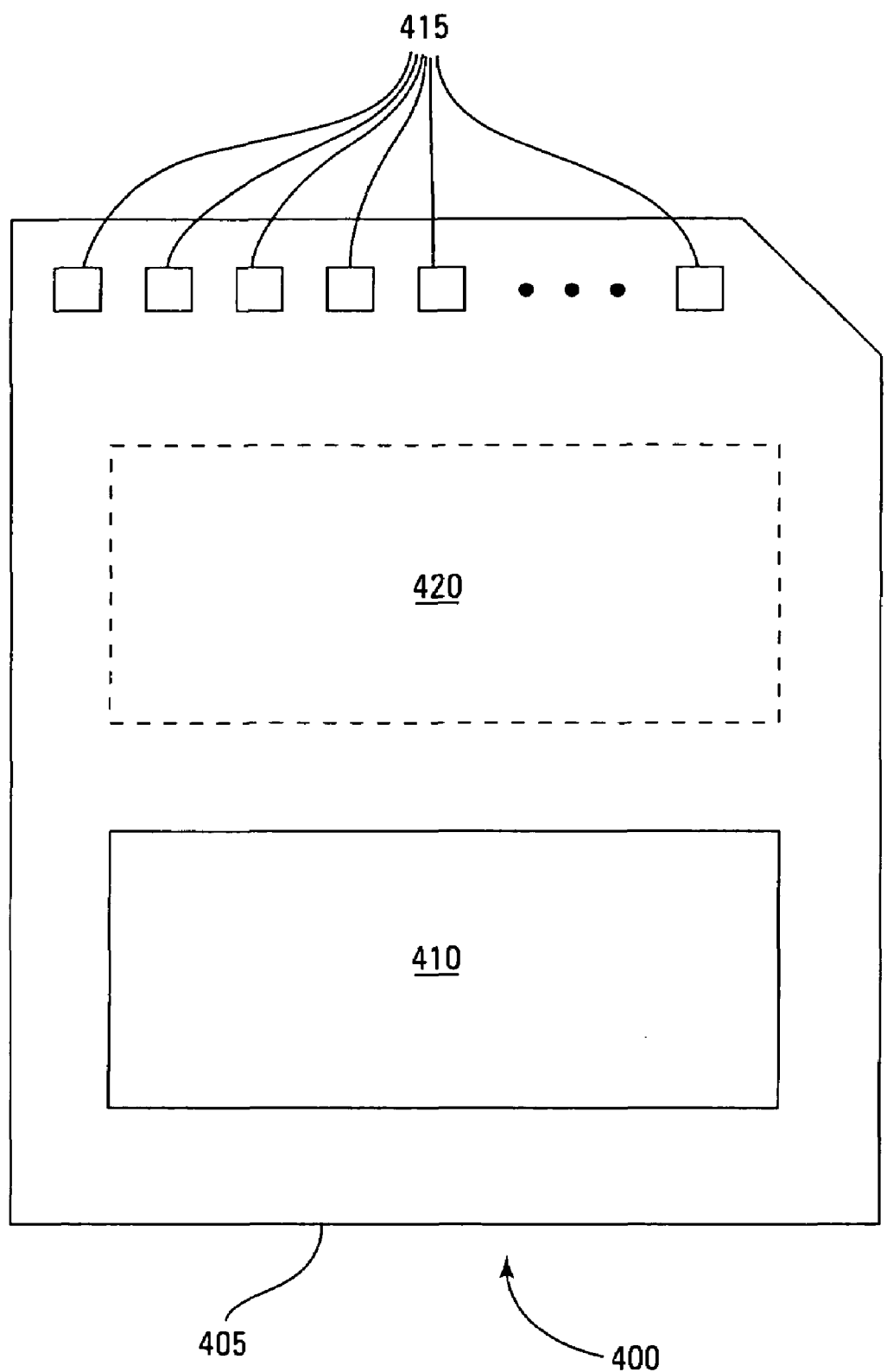
FIG. 4 is an illustration of an exemplary memory module, according to another embodiment of the invention.

FIG. 4 is an illustration of an exemplary memory module 400. Memory module 400 is illustrated as a memory card, although the concepts discussed with reference to memory module 400 are applicable to other types of removable or portable memory, e.g., USB flash drives, and are intended to be within the scope of "memory module" as used herein. In addition, although one example form factor is depicted in FIG. 4, these concepts are applicable to other form factors as well.

In some embodiments, memory module 400 will include a housing 405 (as depicted) to enclose one or more memory devices 410, though such a housing is not essential to all devices or device applications. At least one memory device 410 is a non-volatile memory having series-connected select gates of differing lengths for access to strings of memory cells in accordance with embodiments of the invention. Where present, the housing 405 includes one or more contacts 415 for communication with a host device. Examples of host devices include digital cameras, digital recording and playback devices, PDAs, personal computers, memory card readers, interface hubs and the like. For some embodiments, the contacts 415 are in the form of a standardized interface. For example, with a USB flash drive, the contacts 415 might be in the form of a USB Type-A male connector. For some embodiments, the contacts 415 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 415 provide an interface for passing control, address and/or data signals between the memory module 400 and a host having compatible receptors for the contacts 415.

The memory module 400 may optionally include additional circuitry 420 which may be one or more integrated circuits and/or discrete components. For some embodiments, the additional circuitry 420 may include a memory controller for controlling access across multiple memory devices 410 and/or for providing a translation layer between an external host and a memory device 410. For example, there may not be a one-to-one correspondence between the number of contacts 415 and a number of I/O connections to the one or more memory devices 410. Thus, a memory controller could selectively couple an I/O connection (not shown in FIG. 4) of a memory device 410 to receive the appropriate signal at the appropriate I/O connection at the appropriate time or to provide the appropriate signal at the appropriate contact 415 at the appropriate time. Similarly, the communication protocol between a host and the memory module 400 may be different than what is required for access of a memory device 410. A memory controller could then translate the command sequences received from a host into the appropriate command sequences to achieve the desired access to the memory device 410. Such translation may further include changes in signal voltage levels in addition to command sequences.

The additional circuitry 420 may further include functionality unrelated to control of a memory device 410, such as logic functions as might be performed by an ASIC (application specific integrated circuit). Also, the additional circuitry 420 may include circuitry to restrict read or write access to the memory module 400, such as password protection, biometrics or the like. The additional circuitry 420 may include circuitry to indicate a status of the memory module 400. For example, the additional circuitry 420 may include functionality to determine whether power is being supplied to the memory module 400 and whether the memory module 400 is currently being accessed, and to display an indication of its status, such as a solid light while powered and a flashing light while being accessed. The additional circuitry 420 may further include passive devices, such as decoupling capacitors to help regulate power requirements within the memory module 400.

Figure 5A:
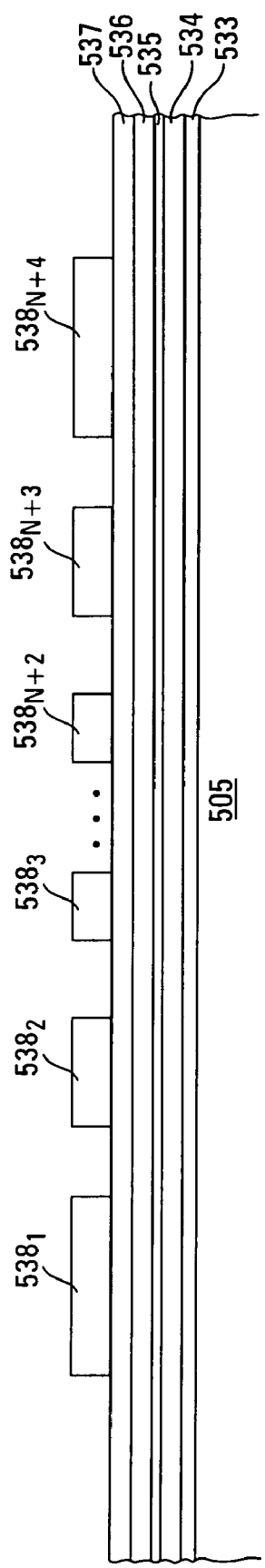
FIGS. 5A-5C are cross-sectional diagrams of a memory array generally depicting a method of forming a portion of a memory array in accordance with another embodiment of the invention.
Figure 5B:
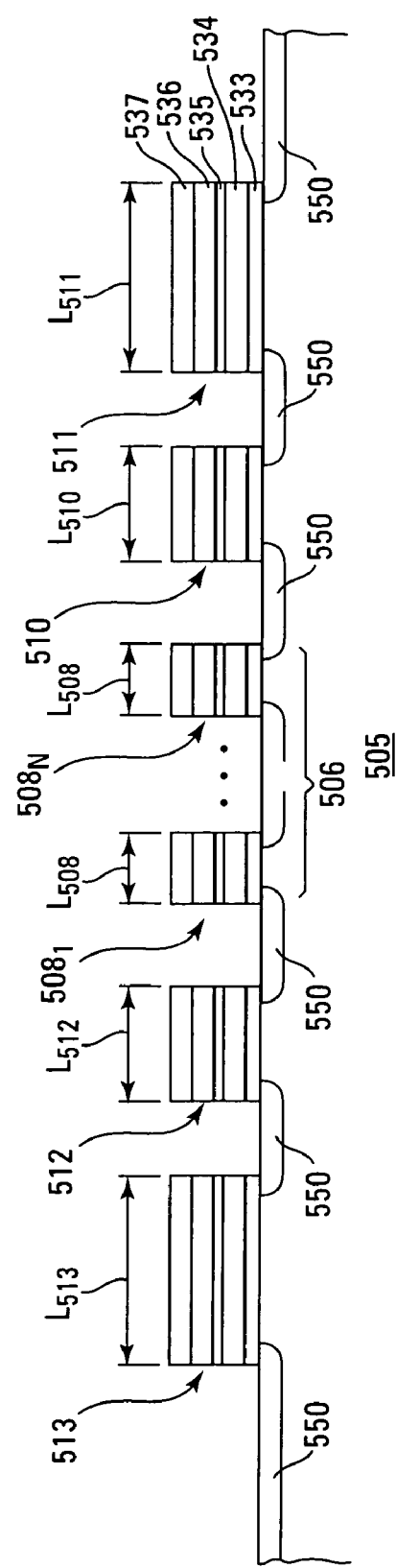
Figure 5C:
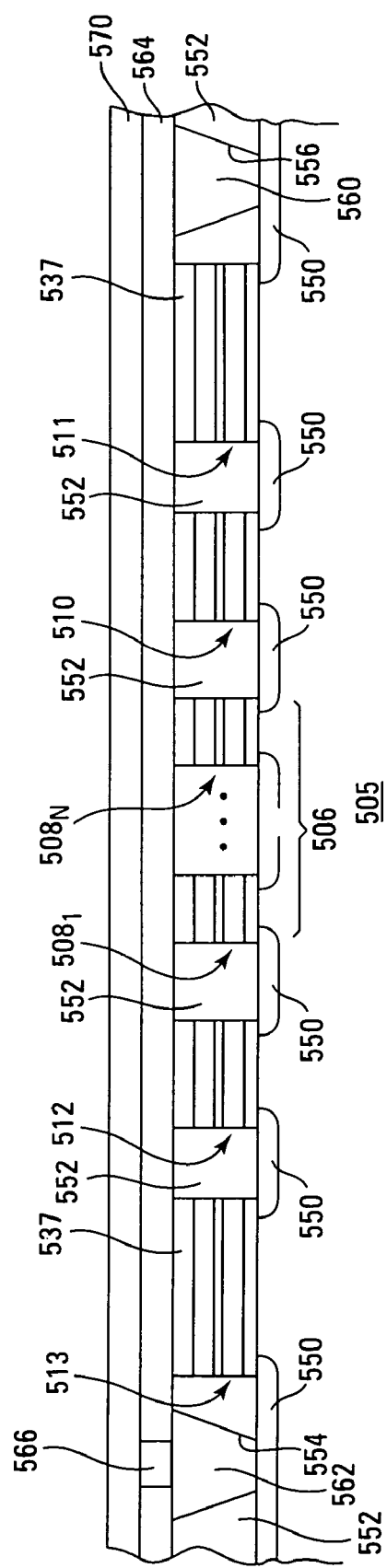

FIGS. 5A-5C are cross-sectional diagrams along a column of a memory array generally depicting a method of forming a portion of the memory array in accordance with one embodiment of the invention. FIG. 5A depicts a portion of the memory array after several processing steps have occurred. Formation of the type of structure depicted in FIG. 5A is well known and will not be detailed herein. In general, FIG. 5A may depict a semiconductor substrate 505 upon which layers of future gate stacks of non-volatile memory cells and select gates are formed. For one embodiment, a dielectric layer 533, a conductive layer 534, a dielectric layer 535, and a conductive layer 536 have been formed on a substrate 505. For one embodiment, an optional cap layer 537, such as a layer of silicon nitride, may be formed on conductive layer 536.

An example of a suitable material for dielectric layer 533 is an oxide that can be blanket deposited or thermally grown on substrate 505. Examples of suitable materials for conductive layer 543 include polysilicon (polycrystalline silicon) or other doped or undoped silicon materials, such as monocrystalline silicon, nanocrystalline silicon, and amorphous silicon. Examples of suitable materials for dielectric layer 535 include one or more layers of dielectric material, a multi-layer dielectric material commonly referred to as ONO (oxide-nitride-oxide), tantalum oxide, barium strontium titanate, silicon nitride, and other materials providing dielectric properties. Examples of suitable materials for conductive layer 536 include polysilicon, such as conductively-doped polysilicon, a metal or metal-containing layer that may be of aluminum, copper, a refractory metal, or a refractory metal silicide. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. For another embodiment, conductive layer 536 may contain multiple metal-containing layers, e.g., a titanium nitride (TiN) barrier layer, a titanium (Ti) adhesion layer overlying the barrier layer, and a tungsten (W) layer overlying the adhesion layer.

A mask layer is formed and patterned into mask-layer segments $538_1$ to $538_{N+4}$ overlying cap layer 537. As one example, a photolithographic resist material could be deposited as the mask layer overlying cap layer 537, exposed to a radiation source, such as UV light, and developed to define areas overlying cap layer 537 for removal.

Note that the mask-layer segments 538 are not all of the same length in the column direction (the horizontal direction of FIG. 5A). Since the lengths of the respective mask-layer segments 512 correspond to the lengths of the gate stacks corresponding to regions underlying the respective mask-layer segments 512, the gate stacks will not all have the same length. For example, mask layer segment $538_1$ has a length for defining a length of an underlying gate stack corresponding to a drain select gate; mask layer segment $538_2$ has a length that is less than the length of mask layer segment $538_1$, for one embodiment, for defining a length of an underlying gate corresponding to another drain select gate; mask layer segments $538_3$ to $538_{N+2}$ have a length for defining lengths of a plurality of gate stacks corresponding to a plurality of memory cells; mask layer segment $538_{N+3}$ has a length for defining a length of a gate stack corresponding to a source select gate; and mask layer segment $538_{N+4}$ has a length that is greater than the length of mask layer segment $538_{N+3}$, for another embodiment, for defining a length of a gate stack corresponding to another source select gate. This is discussed further below.

Following patterning of the mask layer, exposed portions of cap layer 537 and the underlying layers are removed in FIG. 5B, such as by etching or other removal processes, to expose substrate 505. More than one removal process may be used where the chosen removal process is ineffective at removing an underlying layer. Following removal, gate stacks for memory cells 508, gate stacks for source select gates 510 and 511, and gate stacks for drain select gates 512 and 513 are defined, as shown in FIG. 5B. Although source select gates 510 and 511 and drain select gates 512 and 513 are depicted to have the same structure as memory cells 508, for improved conduction and faster operation, it is typical to strap conductive layers 534 and 536 of source select gates 510 and 511 and drain select gates 512 and 513 for this embodiment. Source/drain regions 550 are formed, such as by conductive doping of exposed portions of the substrate 505, as shown in FIG. 5B. Note that memory cells 508 form a NAND string 506.

For memory cells 508, for one embodiment, dielectric layer 533, conductive layer 534, dielectric layer 535, and conductive layer 536, respectively form a tunnel-dielectric layer, a floating-gate layer, an intergate-dielectric layer, and a control-gate layer of the respective memory cells. For other embodiments, dielectric layer 533, conductive layer 534, dielectric layer 535 could represent a charge-trapping floating-node arrangement, such as an ONO (oxide-nitride-oxide) structure of an NROM memory cell. Because the chosen layers for the gate stacks are not a feature or limitation of the invention, other structures may be chosen provided the memory cell gate stacks are capable to selectively providing one of two or more threshold voltages.

For some embodiments, for source select gates 510 and 511 and drain select gates 512 and 513, dielectric layer 533 forms a gate-dielectric layer, and conductive layers 534 and 536, either alone or strapped together, form a control-gate layer of the respective select gates.

Note that drain select gates 512 and 513 respectively have lengths $L_{512}$ and $L_{513}$ in the column direction; source select gates 510 and 511 respectively have lengths $L_{510}$ and $L_{511}$ in the column direction; and memory cells 508 each have a length $L_{508}$ in the column direction. For one embodiment, the length $L_{513}$ of drain select gate 513 is greater than the length $L_{512}$ of drain select gate 512 and thus drain select gate 513 has a greater channel length than drain select gate 512. For another embodiment, the length $L_{511}$ of source select gate 511 is greater than the length $L_{510}$ of source select gate 510 and thus source select gate 511 has a greater channel length than source select gate 510. For another embodiment, the length $L_{513}$ of drain select gate 513 is greater than or equal to the length $L_{511}$ of source select gate 511 and thus drain select gate 513 has a channel length that is greater than or equal to than source select gate 511. For some embodiments, the length $L_{513}$ of drain select gate 513 or the length $L_{512}$ of drain select gate 512 or the length $L_{511}$ of source select gate 511 or the length $L_{510}$ of source select gate 510 is greater than or equal to the length $L_{508}$ of memory cells 508. For other embodiments, the length $L_{513}$ of drain select gate 513 or the length $L_{511}$ of source select gate 511 is greater than or equal to the length $L_{512}$ of drain select gate 512 or the length $L_{510}$ of source select gate 510, and the length $L_{512}$ of drain select gate 512 or the length $L_{510}$ of source select gate 510 is greater than or equal to the length $L_{508}$ of memory cells 508. Alternatively, for one embodiment, the length $L_{508}$ of memory cells 508 may be greater than the lengths of drain select gates 512 and 513 and source select gates 510 and 511.

Increasing the length $L_{513}$ of drain select gate 513 relative to the length $L_{512}$ of drain select gate 512 and/or increasing the length $L_{511}$ of source select gate 511 relative to the length $L_{510}$ of source select gate 510 acts to reduce gate induced drain leakage (GIDL) that can occur through drain select gate 513 and source select gate 511 due to an inherent boosting of their channel voltages during a program operation when a bit line coupled to drain select gate 513 is biased to inhibit programming of the memory cells of the column, a pass voltage is applied to the control gates of the memory cells of the column not targeted for programming, and a programming voltage is applied to one or more of the memory cells of the column target for programming. Typically a voltage, e.g., about 2 volts, applied to the control gate of drain select gate 513 is greater than a voltage, e.g., about zero volts, applied to the control gate of source select gate 511 during the programming operation, and therefore, there is greater likelihood for punch-through to occur for drain select gate 513 than for source select gate 511. This is why the length $L_{513}$ of drain select gate 513 is greater than or equal to the length $L_{511}$ of source select gate 511 for some embodiments.

Moreover, a voltage difference, e.g., about 7 volts, occurs across drain select gates 512 and 513 and a voltage difference, e.g., about 7 volts, occurs across source select gates 510 and 511 due to boosting. It is desirable to have the respective portions of these voltage differences that occur across source select gate 510 and drain select gate 512 to be about the same that occurs across adjacent memory cells 508 during programming, e.g., about 1 volt to about 3 volts, with the respective remaining portions of these voltage differences, e.g., about 4 to 6 volts, occurring across source select gate 511 and drain select gate 513. This may be accomplished, for one embodiment, by setting the ratio of the length $L_{513}$ of drain select gate 513 to the length $L_{512}$ of drain select gate 512 $L_{513}/L_{512}$ to about the ratio of the voltage difference across drain select gate 513 to the voltage difference across drain select gate 512, and setting the ratio of the length $L_{511}$ of source select gate 511 to the length $L_{510}$ of drain select gate 510 $L_{511}/L_{510}$ to about the ratio of the voltage difference across source select gate 511 to the voltage difference across source select gate 510. For another embodiment, $L_{513}/L_{512}$ and $L_{511}/L_{510}$ are about 2.

A bulk insulation layer (or another dielectric layer) 552 is formed overlying the structure of FIG. 5B in FIG. 5C that may be followed by removal of excess portions of insulation layer 552, e.g., by chemical mechanical planerization (CMP), stopping on cap layer 537 so that an upper surface of insulation layer 552 is substantially flush with an upper surface of cap layer 537. One example for the insulation layer 552 would be a doped silicate glass. Examples of doped silicate glasses include BSG (borosilicate glass), PSG (phosphosilicate glass), and BPSG (borophosphosilicate glass). Another example for the insulation layer 552 would be TEOS (tetraethylorthosilicate).

A mask layer (not shown), e.g., an imaging resist layer, is formed overlying insulation layer 552 and cap layer 537 and is patterned for defining areas of insulation layer 552 for removal. The areas of insulation layer 552 defined for removal are removed, e.g., by etching, for forming a contact hole 554 that exposes a source/drain region 550 and a contact hole 556 that that exposes a source/drain region 550, as shown in FIG. 5C. For some embodiments, a slot or a trench may be formed in place of contact hole 556. The slot exposes source/drain regions for multiple columns.

A contact 560, such as a source-line contact, is formed in contact hole 556, and a contact 562, such as a drain-line contact, is formed in contact hole 554. For one embodiment, blanket depositing a conductive material overlying remaining portions of insulation layer 552, cap layer 537, and exposed source/drain regions 550 so as to overfill contact holes 554 and 556, e.g., using chemical vapor deposition (CVD) or physical vapor deposition (PVD) techniques, and subsequent removal of the conductive material, e.g., using CMP, stopping on insulation layer 552 and cap layer 537 forms contacts 560 and 562. Note that for embodiments where contact hole 556 is replaced by a slot, filling the slot with the conductive material forms a source line. Examples of the conductive material of contacts 560 and 562 include polysilicon, such as conductively-doped polysilicon, a metal or metal-containing layer that may be of aluminum, copper, a refractory metal, or a refractory metal silicide. For another embodiment, conductive material of contacts 560 and 562 may contain multiple metal-containing layers, e.g., a titanium nitride (TiN) barrier layer, a titanium (Ti) adhesion layer overlying the barrier layer, and a tungsten (W) layer overlying the adhesion layer.

A dielectric layer 564 is formed overlying contacts 560 and 562, cap layer 537, and insulation layer 552. For one embodiment, a contact (or via plug) 566, such as a bit-line contact, is formed through dielectric layer 564 in direct contact with contact 562, e.g., by CVD. Dielectric layer 564 may be of a dielectric material, such as silicon oxides, TEOS, silicon nitrides, or silicon oxynitrides. For one embodiment, formation of via plug 566 includes patterning a mask layer (not shown) formed overlying dielectric layer 564, followed by the formation of a hole passing through dielectric layer 564 by removal of a portion of dielectric layer 564, e.g., by etching, defined for removal by the patterning to expose a portion of contact 562. For one embodiment, via plug 566 may include one or more refractory metals. For another embodiment, via plug 566 may include a barrier layer, such as TiN, in contact with drain contact 562, a first metal layer, such as titanium (Ti), on the barrier layer, a second metal layer, such as tungsten (W), on the first metal layer.

Subsequently, a conductive layer 570 that may be a metal layer, such as aluminum, is deposited on dielectric layer 564 in electrical contact with via plug 566, e.g., using CVD. Conductive layer 570 is patterned, etched, and processed, e.g., using standard processing, to produce individual bit lines therefrom.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A portion of a memory array, comprising:
   a string of two or more non-volatile memory cells;
   a first select gate coupled in series with one non-volatile memory cell of the string of two or more non-volatile memory cells; and
   a second select gate coupled in series with the first select gate;
   wherein a length of the second select gate is greater than a length of the first select gate.

2. The portion of a memory array of claim 1 further comprises:
   a third select gate coupled in series with a second non-volatile memory cell of the string of non-volatile memory cells; and
   a fourth select gate coupled in series with the third select gate.

3. The portion of a memory array of claim 2, wherein a length of the fourth select gate is greater than a length of the third select gate.

4. The portion of a memory array of claim 2, wherein the length of the second select gate is greater than or equal to a length of the fourth select gate.

5. The portion of a memory array of claim 2, wherein a length of the fourth select gate is greater than or equal to the length of the first select gate.

6. The portion of a memory array of claim 2, wherein lengths of the two or more non-volatile memory cells are selected from the group consisting of lengths less than or equal to the length of the first select gate, the length of the second select gate, a length of the third select gate, and a length of the fourth select gate.

7. The portion of a memory array of claim 1 further comprises a bit line coupled to the second select gate.

8. A portion of a NAND architecture memory array, comprising:
   two or more series-coupled non-volatile memory cells;
   a first select gate coupled in series with one of the of the series-coupled non-volatile memory cells; and
   a second select gate coupled in series with the first select gate;
   wherein a length of the second select gate is greater than a length of the first select gate.

9. The portion of the NAND architecture memory array of claim 8 further comprises:
   a third select gate coupled in series with a second one of the series-coupled non-volatile memory cells; and
   a fourth select gate coupled in series with the third select gate.

10. The portion of the NAND architecture memory array of claim 9, wherein a length of the fourth select gate is greater than a length of the third select gate.

11. The portion of the NAND architecture memory array of claim 9, wherein the length of the second select gate is greater than or equal to a length of the fourth select gate.

12. The portion of the NAND architecture memory array of claim 9, wherein a length of the fourth select gate is greater than or equal to the length of the first select gate.

13. The portion of the NAND architecture memory array of claim 9, wherein lengths of the two or more non-volatile memory cells are selected from the group consisting of lengths less than or equal to the length of the first select gate, the length of the second select gate, a length of the third select gate, and a length of the fourth select gate.

14. A portion of a memory array, comprising:
   a string of two or more non-volatile memory cells;
   a first select gate coupled in series with a first non-volatile memory cell of the string of two or more non-volatile memory cells;
   a second select gate coupled in series with the first select gate;
   a third select gate coupled in series with a last non-volatile memory cell of the string of two or more non-volatile memory cells; and
   a fourth select gate coupled in series with the third select gate;
   wherein a length of the second select gate is greater than a length of the first select gate; and
   wherein a length of the fourth select gate is greater than a length of the third select gate.

15. The portion of a memory array of claim 14, wherein the length of the second select gate is greater than or equal to the length of the fourth select gate.

16. The portion of a memory array of claim 14, wherein the length of the fourth select gate is greater than or equal to the length of the first select gate.

17. The portion of a memory array of claim 14, wherein lengths of the two or more non-volatile memory cells are selected from the group consisting of lengths less than or equal to the length of the first select gate, the length of the second select gate, the length of the third select gate, and the length of the fourth select gate.

18. The portion of a memory array of claim 14 further comprises a bit line coupled to the second select gate.

19. The portion of a memory array of claim 14 further comprises a source line coupled to the fourth select gate.

20. A portion of a NAND architecture memory array, comprising:

two or more series-coupled non-volatile memory cells;
a first select gate coupled in series with a first non-volatile memory cell of the series-coupled non-volatile memory cells;
a second select gate coupled in series with the first select gate;
a third select gate coupled in series with a last non-volatile memory cell of the series-coupled non-volatile memory cells; and
a fourth select gate coupled in series with the third select gate;
wherein a length of the second select gate is greater than a length of the first select gate; and
wherein a length of the fourth select gate is greater than a length of the third select gate.

21. The portion of the NAND architecture memory array of claim 20, wherein the length of the second select gate is greater than or equal to the length of the fourth select gate.

22. The portion of the NAND architecture memory array of claim 20, wherein the length of the fourth select gate is greater than or equal to a length of the first select gate.

23. The portion of the NAND architecture memory array of claim 20, wherein lengths of the two or more non-volatile memory cells are selected from the group consisting of lengths less than or equal to the length of the first select gate, the length of the second select gate, the length of the third select gate, and the length of the fourth select gate.

24. A portion of a NAND architecture memory array, comprising:
a first select gate having a first source/drain region and a second source/drain region;
a second select gate having a first source/drain region and a second source/drain region, wherein the first source/drain region of the second select gate is coupled to the second source/drain region of the first select gate; and
a plurality of series-coupled non-volatile memory cells, wherein an end one of the series-coupled non-volatile memory cells has a first source/drain region and a second source/drain region and wherein the first source/drain region of the end one of the series-coupled non-volatile memory cells is coupled to the second source/drain region of the second select gate;
wherein a length of the first select gate is greater than a length of the second select gate.

25. The portion of the NAND architecture memory array of claim 24, wherein a length of each of the non-volatile memory cells is selected from the group consisting of lengths less than or equal to the length of the first select gate and the length of the second select gate.

26. The portion of the NAND architecture memory array of claim 24 further comprises a bit line coupled to the first source/drain region of the first select gate.

27. A portion of a NAND architecture memory array, comprising:
a first select gate having a first source/drain region and a second source/drain region;
a second select gate having a first source/drain region and a second source/drain region, wherein the first source/drain region of the second select gate is coupled to the second source/drain region of the first select gate;
a third select gate having a first source/drain region and a second source/drain region;
a fourth select gate having a first source/drain region and a second source/drain region, wherein the first source/drain region of the fourth select gate is coupled to the second source/drain region of the third select gate; and
a string of series-coupled non-volatile memory cells, wherein a first non-volatile memory cell located at a first end of the string of series-coupled non-volatile memory cells has a first source/drain region and a second source/drain region, wherein the first source/drain region of the first non-volatile memory cell is coupled to the second source/drain region of the second select gate, wherein a second non-volatile memory cell located at a second end of the string of series-coupled non-volatile memory cells opposite the first end has a first source/drain region and a second source/drain region, wherein the second source/drain region of the second non-volatile memory cell is coupled to the first source/drain region of the third select gate;
wherein a length of the first select gate is greater than a length of the second select gate; and
wherein a length of the fourth select gate is greater than a length of the third select gate.

28. The portion of the NAND architecture memory array of claim 27, wherein the length of the first select gate is greater than or equal to the length of the fourth select gate.

29. The portion of the NAND architecture memory array of claim 27, wherein the length of the fourth select gate is greater than or equal to the length of the second select gate.

30. The portion of the NAND architecture memory array of claim 27, wherein lengths of each of the non-volatile memory cells are selected from the group consisting of lengths less than or equal to the length of the first select gate, the length of the second select gate, the length of the third select gate, and the length of the fourth select gate.

31. The portion of the NAND architecture memory array of claim 27 further comprises a bit line coupled to the first source/drain region of the first select gate.

32. The portion of the NAND architecture memory array of claim 31 further comprises a source line coupled to the second source/drain region of the fourth select gate.

33. A memory device, comprising:
an array of non-volatile memory cells; and
circuitry for control and/or access of the array of non-volatile memory cells;
wherein the array of non-volatile memory cells comprises:
one or more strings of two or more series-coupled non-volatile memory cells;
a first select gate coupled in series with one non-volatile memory cell of each of the one or more strings of two or more series-coupled non-volatile memory cells; and
a second select gate coupled in series with the first select gate;
wherein a length of the second select gate is greater than a length of the first select gate.

34. A memory device, comprising:
an array of non-volatile memory cells; and
circuitry for control and/or access of the array of non-volatile memory cells;
wherein the array of non-volatile memory cells comprises:
one or more strings of two or more series-coupled non-volatile memory cells;
a first select gate coupled in series with a first non-volatile memory cell of each of the one or more strings of two or more series-coupled non-volatile memory cells;
a second select gate coupled in series with the first select gate;

a third select gate coupled in series with a last non-volatile memory cell of each of the one or more strings of two or more series-coupled non-volatile memory cells; and a fourth select gate coupled in series with the third select gate;

wherein a length of the second select gate is greater than a length of the first select gate; and wherein a length of the fourth select gate is greater than a length of the third select gate.

35. A memory device, comprising:

an array of non-volatile memory cells; and circuitry for control and/or access of the array of non-volatile memory cells;

wherein the array of non-volatile memory cells comprises:

at least one string of two or more series-coupled non-volatile memory cells, wherein an end one of the series-coupled non-volatile memory cells of the at least one string of series-coupled non-volatile memory cells has a first source/drain region and a second source/drain region;

a first select gate having a first source/drain region and a second source/drain region; and a second select gate having a first source/drain region and a second source/drain region, wherein the first source/drain region of the second select gate is coupled to the second source/drain region of the first select gate, and wherein the second source/drain region of the second select gate is coupled to the first source/drain region of the end one of the series-coupled non-volatile memory cells of the at least one string of series-coupled non-volatile memory cells;

wherein a length of the first select gate is greater than a length of the second select gate.

36. A memory device, comprising:

an array of non-volatile memory cells; and circuitry for control and/or access of the array of non-volatile memory cells;

wherein the array of non-volatile memory cells comprises:

at least one string of series-coupled non-volatile memory cells, wherein a first non-volatile memory cell located at a first end of the at least one string of series-coupled non-volatile memory cells has a first source/drain region and a second source/drain region, and wherein a second non-volatile memory cell located at a second end of the at least one string of series-coupled non-volatile memory cells opposite the first end has a first source/drain region and a second source/drain region;

a first select gate having a first source/drain region and a second source/drain region;

a second select gate having a first source/drain region and a second source/drain region, wherein the first source/drain region of the second select gate is coupled to the second source/drain region of the first select gate, and wherein the second source/drain region of the second select gate is coupled to the first source/drain region of the first non-volatile memory cell of the at least one string of series-coupled non-volatile memory cells;

a third select gate having a first source/drain region and a second source/drain region, wherein the first source/drain region of the third select gate is coupled to the second source/drain region of the second non-volatile memory cell of the at least one string of series-coupled non-volatile memory cells; and a fourth select gate having a first source/drain region and a second source/drain region, wherein the first source/drain region of the fourth select gate is coupled to the second source/drain region of the third select gate;

wherein a length of the first select gate is greater than a length of the second select gate; and wherein a length of the fourth select gate is greater than a length of the third select gate.

37. A memory device, comprising:

an array of non-volatile memory cells; and circuitry for control and/or access of the array of non-volatile memory cells;

wherein the array of non-volatile memory cells comprises:

at least one string of series-coupled non-volatile memory cells, wherein a first non-volatile memory cell located at a first end of the at least one string of series-coupled non-volatile memory cells has a first source/drain region and a second source/drain region, and wherein a second non-volatile memory cell located at a second end of the at least one string of series-coupled non-volatile memory cells opposite the first end has a first source/drain region and a second source/drain region;

a first select gate having a first source/drain region and a second source/drain region;

a second select gate having a first source/drain region and a second source/drain region, wherein the first source/drain region of the second select gate is coupled to the second source/drain region of the first select gate, and wherein the second source/drain region of the second select gate is coupled to the first source/drain region of the first non-volatile memory cell of the at least one string of series-coupled non-volatile memory cells;

a third select gate having a first source/drain region and a second source/drain region, wherein the first source/drain region of the third select gate is coupled to the second source/drain region of the second non-volatile memory cell of the at least one string of series-coupled non-volatile memory cells;

a fourth select gate having a first source/drain region and a second source/drain region, wherein the first source/drain region of the fourth select gate is coupled to the second source/drain region of the third select gate;

a bit line coupled to the first source/drain region of the first select gate; and a source line coupled to the second source/drain region of the fourth select gate;

wherein a length of the first select gate is greater than a length of the second select gate; and wherein a length of the fourth select gate is greater than a length of the third select gate.

38. A memory module, comprising:

a plurality of contacts; and two or more memory devices, each having access lines selectively coupled to the plurality of contacts;

wherein at least one of the memory devices comprises:

an array of non-volatile memory cells; and circuitry for control and/or access of the array of non-volatile memory cells;

wherein the array of non-volatile memory cells comprises:

one or more strings of two or more series-coupled non-volatile memory cells;

a first select gate coupled in series with one non-volatile memory cell of each of the one or more strings of two or more series-coupled non-volatile memory cells; and
a second select gate coupled in series with the first select gate;
wherein a length of the second select gate is greater than a length of the first select gate.

39. A memory module, comprising:
a plurality of contacts; and
two or more memory devices, each having access lines selectively coupled to the plurality of contacts;
wherein at least one of the memory devices comprises:
an array of non-volatile memory cells; and
circuitry for control and/or access of the array of non-volatile memory cells;
wherein the array of non-volatile memory cells comprises:
one or more strings of two or more series-coupled non-volatile memory cells;
a first select gate coupled in series with a first non-volatile memory cell of each of the one or more strings of two or more series-coupled non-volatile memory cells;
a second select gate coupled in series with the first select gate;
a third select gate coupled in series with a last non-volatile memory cell of each of the one or more strings of two or more series-coupled non-volatile memory cells; and
a fourth select gate coupled in series with the third select gate;
wherein a length of the second select gate is greater than a length of the first select gate; and
wherein a length of the fourth select gate is greater than a length of the third select gate.

40. A memory module, comprising:
a plurality of contacts; and
two or more memory devices, each having access lines selectively coupled to the plurality of contacts;
wherein at least one of the memory devices comprises:
an array of non-volatile memory cells; and
circuitry for control and/or access of the array of non-volatile memory cells;
wherein the array of non-volatile memory cells comprises:
at least one string of two or more series-coupled non-volatile memory cells, wherein an end one of the series-coupled non-volatile memory cells of the at least one string of series-coupled non-volatile memory cells has a first source/drain region and a second source/drain region;
a first select gate having a first source/drain region and a second source/drain region; and
a second select gate having a first source/drain region and a second source/drain region, wherein the first source/drain region of the second select gate is coupled to the second source/drain region of the first select gate, and wherein the second source/drain region of the second select gate is coupled to the first source/drain region of the end one of the series-coupled non-volatile memory cells of the at least one string of series-coupled non-volatile memory cells;
wherein a length of the first select gate is greater than a length of the second select gate.

41. A memory module, comprising:
a plurality of contacts; and
two or more memory devices, each having access lines selectively coupled to the plurality of contacts;
wherein at least one of the memory devices comprises:
an array of non-volatile memory cells; and
circuitry for control and/or access of the array of non-volatile memory cells;
wherein the array of non-volatile memory cells comprises:
at least one string of series-coupled non-volatile memory cells, wherein a first non-volatile memory cell located at a first end of the at least one string of series-coupled non-volatile memory cells has a first source/drain region and a second source/drain region, and wherein a second non-volatile memory cell located at a second end of the at least one string of series-coupled non-volatile memory cells opposite the first end has a first source/drain region and a second source/drain region;
a first select gate having a first source/drain region and a second source/drain region;
a second select gate having a first source/drain region and a second source/drain region, wherein the first source/drain region of the second select gate is coupled to the second source/drain region of the first select gate, and wherein the second source/drain region of the second select gate is coupled to the first source/drain region of the first non-volatile memory cell of the at least one string of series-coupled non-volatile memory cells;
a third select gate having a first source/drain region and a second source/drain region, wherein the first source/drain region of the third select gate is coupled to the second source/drain region of the second non-volatile memory cell of the at least one string of series-coupled non-volatile memory cells; and
a fourth select gate having a first source/drain region and a second source/drain region, wherein the first source/drain region of the fourth select gate is coupled to the second source/drain region of the third select gate;
wherein a length of the first select gate is greater than a length of the second select gate; and
wherein a length of the fourth select gate is greater than a length of the third select gate.

42. A memory module, comprising:
a plurality of contacts; and
two or more memory devices, each having access lines selectively coupled to the plurality of contacts;
wherein at least one of the memory devices comprises:
an array of non-volatile memory cells; and
circuitry for control and/or access of the array of non-volatile memory cells;
wherein the array of non-volatile memory cells comprises:
at least one string of series-coupled non-volatile memory cells, wherein a first non-volatile memory cell located at a first end of the at least one string of series-coupled non-volatile memory cells has a first source/drain region and a second source/drain region, and wherein a second non-volatile memory cell located at a second end of the at least one string of series-coupled non-volatile memory cells opposite the first end has a first source/drain region and a second source/drain region;

a first select gate having a first source/drain region and a second source/drain region;

a second select gate having a first source/drain region and a second source/drain region, wherein the first source/drain region of the second select gate is coupled to the second source/drain region of the first select gate, and wherein the second source/drain region of the second select gate is coupled to the first source/drain region of the first non-volatile memory cell of the at least one string of series-coupled non-volatile memory cells;

a third select gate having a first source/drain region and a second source/drain region, wherein the first source/drain region of the third select gate is coupled to the second source/drain region of the second non-volatile memory cell of the at least one string of series-coupled non-volatile memory cells;

a fourth select gate having a first source/drain region and a second source/drain region, wherein the first source/drain region of the fourth select gate is coupled to the second source/drain region of the third select gate;

a bit line coupled to the first source/drain region of the first select gate; and a source line coupled to the second source/drain region of the fourth select gate;

wherein a length of the first select gate is greater than a length of the second select gate; and wherein a length of the fourth select gate is greater than a length of the third select gate.

43. A memory module, comprising:
a housing having a plurality of contacts; and
one or more memory devices enclosed in the housing and selectively coupled to the plurality of contacts;
wherein at least one of the memory devices comprises:
  an array of non-volatile memory cells; and
  circuitry for control and/or access of the array of non-volatile memory cells;
  wherein the array of non-volatile memory cells comprises:
    one or more strings of two or more series-coupled non-volatile memory cells;
    a first select gate coupled in series with one non-volatile memory cell of each of the one or more strings of two or more series-coupled non-volatile memory cells; and
    a second select gate coupled in series with the first select gate;
    wherein a length of the second select gate is greater than a length of the first select gate.

44. A memory module, comprising:
a housing having a plurality of contacts; and
one or more memory devices enclosed in the housing and selectively coupled to the plurality of contacts;
wherein at least one of the memory devices comprises:
  an array of non-volatile memory cells; and
  circuitry for control and/or access of the array of non-volatile memory cells;
  wherein the array of non-volatile memory cells comprises:
    one or more strings of two or more series-coupled non-volatile memory cells;
    a first select gate coupled in series with a first non-volatile memory cell of each of the one or more strings of two or more series-coupled non-volatile memory cells;
    a second select gate coupled in series with the first select gate;
    a third select gate coupled in series with a last non-volatile memory cell of each of the one or more strings of two or more series-coupled non-volatile memory cells; and
    a fourth select gate coupled in series with the third select gate;
    wherein a length of the second select gate is greater than a length of the first select gate; and
    wherein a length of the fourth select gate is greater than a length of the third select gate.

45. A memory module, comprising:
a housing having a plurality of contacts; and
one or more memory devices enclosed in the housing and selectively coupled to the plurality of contacts;
wherein at least one of the memory devices comprises:
  an array of non-volatile memory cells; and
  circuitry for control and/or access of the array of non-volatile memory cells;
  wherein the array of non-volatile memory cells comprises:
    at least one string of two or more series-coupled non-volatile memory cells, wherein an end one of the series-coupled non-volatile memory cells of the at least one string of series-coupled non-volatile memory cells has a first source/drain region and a second source/drain region;
    a first select gate having a first source/drain region and a second source/drain region; and
    a second select gate having a first source/drain region and a second source/drain region, wherein the first source/drain region of the second select gate is coupled to the second source/drain region of the first select gate, and wherein the second source/drain region of the second select gate is coupled to the first source/drain region of the end one of the series-coupled non-volatile memory cells of the at least one string of series-coupled non-volatile memory cells;
    wherein a length of the first select gate is greater than a length of the second select gate.

46. A memory module, comprising:
a housing having a plurality of contacts; and
one or more memory devices enclosed in the housing and selectively coupled to the plurality of contacts;
wherein at least one of the memory devices comprises:
  an array of non-volatile memory cells; and
  circuitry for control and/or access of the array of non-volatile memory cells;
  wherein the array of non-volatile memory cells comprises:
    at least one string of series-coupled non-volatile memory cells, wherein a first non-volatile memory cell located at a first end of the at least one string of series-coupled non-volatile memory cells has a first source/drain region and a second source/drain region, and wherein a second non-volatile memory cell located at a second end of the at least one string of series-coupled non-volatile memory cells opposite the first end has a first source/drain region and a second source/drain region;
    a first select gate having a first source/drain region and a second source/drain region;
    a second select gate having a first source/drain region and a second source/drain region, wherein the first source/drain region of the second select gate is coupled to the second source/drain region of the first select gate, and wherein the second source/drain region of the second select gate is coupled to the first source/drain region of the first non-volatile memory cell of the at least one string of series-coupled non-volatile memory cells;

a third select gate having a first source/drain region and a second source/drain region, wherein the first source/drain region of the third select gate is coupled to the second source/drain region of the second non-volatile memory cell of the at least one string of series-coupled non-volatile memory cells; and a fourth select gate having a first source/drain region and a second source/drain region, wherein the first source/drain region of the fourth select gate is coupled to the second source/drain region of the third select gate;

wherein a length of the first select gate is greater than a length of the second select gate; and wherein a length of the fourth select gate is greater than a length of the third select gate.

47. A memory module, comprising:

a housing having a plurality of contacts; and one or more memory devices enclosed in the housing and selectively coupled to the plurality of contacts;

wherein at least one of the memory devices comprises:

an array of non-volatile memory cells; and circuitry for control and/or access of the array of non-volatile memory cells;

wherein the array of non-volatile memory cells comprises:

at least one string of series-coupled non-volatile memory cells, wherein a first non-volatile memory cell located at a first end of the at least one string of series-coupled non-volatile memory cells has a first source/drain region and a second source/drain region, and wherein a second non-volatile memory cell located at a second end of the at least one string of series-coupled non-volatile memory cells opposite the first end has a first source/drain region and a second source/drain region;

a first select gate having a first source/drain region and a second source/drain region;

a second select gate having a first source/drain region and a second source/drain region, wherein the first source/drain region of the second select gate is coupled to the second source/drain region of the first select gate, and wherein the second source/drain region of the second select gate is coupled to the first source/drain region of the first non-volatile memory cell of the at least one string of series-coupled non-volatile memory cells;

a third select gate having a first source/drain region and a second source/drain region, wherein the first source/drain region of the third select gate is coupled to the second source/drain region of the second non-volatile memory cell of the at least one string of series-coupled non-volatile memory cells;

a fourth select gate having a first source/drain region and a second source/drain region, wherein the first source/drain region of the fourth select gate is coupled to the second source/drain region of the third select gate;

a bit line coupled to the first source/drain region of the first select gate; and a source line coupled to the second source/drain region of the fourth select gate;

wherein a length of the first select gate is greater than a length of the second select gate; and wherein a length of the fourth select gate is greater than a length of the third select gate.

48. An electronic system, comprising:

a processor; and one or more memory devices coupled to the processor, wherein at least one of the memory devices comprises:

an array of non-volatile memory cells; and circuitry for control and/or access of the array of non-volatile memory cells;

wherein the array of non-volatile memory cells comprises:

one or more strings of two or more series-coupled non-volatile memory cells;

a first select gate coupled in series with one non-volatile memory cell of each of the one or more strings of two or more series-coupled non-volatile memory cells; and a second select gate coupled in series with the first select gate;

wherein a length of the second select gate is greater than a length of the first select gate.

49. An electronic system, comprising:

a processor; and one or more memory devices coupled to the processor, wherein at least one of the memory devices comprises:

an array of non-volatile memory cells; and circuitry for control and/or access of the array of non-volatile memory cells;

wherein the array of non-volatile memory cells comprises:

one or more strings of two or more series-coupled non-volatile memory cells;

a first select gate coupled in series with a first non-volatile memory cell of each of the one or more strings of two or more series-coupled non-volatile memory cells;

a second select gate coupled in series with the first select gate;

a third select gate coupled in series with a last non-volatile memory cell of each of the one or more strings of two or more series-coupled non-volatile memory cells; and a fourth select gate coupled in series with the third select gate;

wherein a length of the second select gate is greater than a length of the first select gate; and wherein a length of the fourth select gate is greater than a length of the third select gate.

50. An electronic system, comprising:

a processor; and one or more memory devices coupled to the processor, wherein at least one of the memory devices comprises:

an array of non-volatile memory cells; and circuitry for control and/or access of the array of non-volatile memory cells;

wherein the array of non-volatile memory cells comprises:

at least one string of two or more series-coupled non-volatile memory cells, wherein an end one of the series-coupled non-volatile memory cells of the at least one string of series-coupled non-volatile memory cells has a first source/drain region and a second source/drain region;

a first select gate having a first source/drain region and a second source/drain region; and a second select gate having a first source/drain region and a second source/drain region, wherein the first source/drain region of the second select gate is coupled to the second source/drain region of the first select gate, and wherein the second source/drain region of the second select gate is coupled to the first source/drain region of the end one of the series-coupled non-volatile memory cells of the at least one string of series-coupled non-volatile memory cells;

wherein a length of the first select gate is greater than a length of the second select gate.

51. An electronic system, comprising:

a processor; and one or more memory devices coupled to the processor, wherein at least one of the memory devices comprises:

an array of non-volatile memory cells; and circuitry for control and/or access of the array of non-volatile memory cells;

wherein the array of non-volatile memory cells comprises:

at least one string of series-coupled non-volatile memory cells, wherein a first non-volatile memory cell located at a first end of the at least one string of series-coupled non-volatile memory cells has a first source/drain region and a second source/drain region, and wherein a second non-volatile memory cell located at a second end of the at least one string of series-coupled non-volatile memory cells opposite the first end has a first source/drain region and a second source/drain region;

a first select gate having a first source/drain region and a second source/drain region;

a second select gate having a first source/drain region and a second source/drain region, wherein the first source/drain region of the second select gate is coupled to the second source/drain region of the first select gate, and wherein the second source/drain region of the second select gate is coupled to the first source/drain region of the first non-volatile memory cell of the at least one string of series-coupled non-volatile memory cells;

a third select gate having a first source/drain region and a second source/drain region, wherein the first source/drain region of the third select gate is coupled to the second source/drain region of the second non-volatile memory cell of the at least one string of series-coupled non-volatile memory cells; and a fourth select gate having a first source/drain region and a second source/drain region, wherein the first source/drain region of the fourth select gate is coupled to the second source/drain region of the third select gate;

wherein a length of the first select gate is greater than a length of the second select gate; and wherein a length of the fourth select gate is greater than a length of the third select gate.

52. An electronic system, comprising:

a processor; and one or more memory devices coupled to the processor, wherein at least one of the memory devices comprises:

an array of non-volatile memory cells; and circuitry for control and/or access of the array of non-volatile memory cells;

wherein the array of non-volatile memory cells comprises:

at least one string of series-coupled non-volatile memory cells, wherein a first non-volatile memory cell located at a first end of the at least one string of series-coupled non-volatile memory cells has a first source/drain region and a second source/drain region, and wherein a second non-volatile memory cell located at a second end of the at least one string of series-coupled non-volatile memory cells opposite the first end has a first source/drain region and a second source/drain region;

a first select gate having a first source/drain region and a second source/drain region;

a second select gate having a first source/drain region and a second source/drain region, wherein the first source/drain region of the second select gate is coupled to the second source/drain region of the first select gate, and wherein the second source/drain region of the second select gate is coupled to the first source/drain region of the first non-volatile memory cell of the at least one string of series-coupled non-volatile memory cells;

a third select gate having a first source/drain region and a second source/drain region, wherein the first source/drain region of the third select gate is coupled to the second source/drain region of the second non-volatile memory cell of the at least one string of series-coupled non-volatile memory cells;

a fourth select gate having a first source/drain region and a second source/drain region, wherein the first source/drain region of the fourth select gate is coupled to the second source/drain region of the third select gate;

a bit line coupled to the first source/drain region of the first select gate; and a source line coupled to the second source/drain region of the fourth select gate;

wherein a length of the first select gate is greater than a length of the second select gate; and wherein a length of the fourth select gate is greater than a length of the third select gate.

* * * * *

UNITED STATES PATENT AND TRADEMARK OFFICE
CERTIFICATE OF CORRECTION

PATENT NO. : 7,440,321 B2  Page 1 of 1
APPLICATION NO. : 11/402535
DATED : October 21, 2008
INVENTOR(S) : Aritome It is certified that error appears in the above-identified patent and that said Letters Patent is hereby corrected as shown below:

In column 10, line 6, in Claim 8, after "of the" delete "of the".

Signed and Sealed this

Thirteenth Day of January, 2009

JON W. DUDAS
*Director of the United States Patent and Trademark Office*